(12) United States Patent
Conner

(10) Patent No.: US 7,046,027 B2
(45) Date of Patent: May 16, 2006

(54) INTERFACE APPARATUS FOR SEMICONDUCTOR DEVICE TESTER

(75) Inventor: George W. Conner, Camarillo, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/966,480

(22) Filed: Oct. 15, 2004

(65) Prior Publication Data
US 2006/0082358 A1 Apr. 20, 2006

(51) Int. Cl.
*G01R 31/28* (2006.01)
*G01R 31/26* (2006.01)

(52) U.S. Cl. .................... 324/765; 324/158.1; 324/73.1

(58) Field of Classification Search .................. None
See application file for complete search history.

(56) References Cited

U.S. PATENT DOCUMENTS

| | | | | |
|---|---|---|---|---|
| 5,794,175 A | * | 8/1998 | Conner | 702/119 |
| 5,806,181 A | * | 9/1998 | Khandros et al. | 29/874 |
| 5,828,226 A | * | 10/1998 | Higgins et al. | 324/762 |
| 5,974,662 A | * | 11/1999 | Eldridge et al. | 29/842 |
| 6,050,829 A | * | 4/2000 | Eldridge et al. | 439/67 |
| 6,525,407 B1 | * | 2/2003 | Drewery | 257/666 |
| 6,690,185 B1 | * | 2/2004 | Khandros et al. | 324/758 |
| 6,812,718 B1 | * | 11/2004 | Chong et al. | 324/754 |
| 6,888,362 B1 | * | 5/2005 | Eldridge et al. | 324/757 |
| 6,888,366 B1 | * | 5/2005 | Kim et al. | 324/765 |
| 6,891,385 B1 | * | 5/2005 | Miller | 324/760 |
| 6,954,079 B1 | * | 10/2005 | Sugimoto et al. | 324/763 |
| 2002/0081758 A1 | * | 6/2002 | Iriki | 438/16 |

* cited by examiner

*Primary Examiner*—Paresh Patel
(74) *Attorney, Agent, or Firm*—Wolf, Greenfield & Sacks, P.C.

(57) ABSTRACT

A signal interface to connect a semiconductor tester to a device under test. The Interface includes a generic component and customized component. The generic component includes multiple copies of electronic elements that can be connected in signal paths between the tester and the device under test. The customized component is constructed for a specific device under test and provides connections between generic contact points on the generic component and test points on the device under test. In addition, the customized component has conductive members that can be used to interconnect the electronic elements on the generic component. The connections configure the electronic elements into signal conditioning circuitry, thereby providing signal paths through the interface that are compatible with the I/O characteristics of specific test points on a device under test. The generic and the customized components may be fabricated on semiconductor wafers.

24 Claims, 7 Drawing Sheets

INTERFACE APPARATUS FOR SEMICONDUCTOR DEVICE TESTER

BACKGROUND OF INVENTION

1. Field of Invention

This application relates generally to test and measurement equipment and more specifically to interfaces between testers and devices under test.

2. Discussion of Related Art

Automated test equipment is used extensively to ensure the proper functioning of semiconductor devices. Testing allows for the removal of defective devices from fabrication lots, thus eliminating further unnecessary processing and packaging. In addition, test results may be used to identify malfunctioning fabrication equipment requiring maintenance, thereby increasing device yields. Test results also allow for binning of devices possessing varying performance and operating specifications resulting from processing variations. For example, a device with test results indicating the device does not meet desired specifications may be packaged and sold at a lower price with labeling indicating reduced operating ranges and/or performance.

To measure device operation, automatic test equipment (also referred to as a tester) applies input signals to a device under test ("DUT") and detects the resulting DUT output signals. FIG. 1 illustrates, in simplified form, a tester 100 comprising a controller 120 and multiple channels $130_1$, $130_2$, ... $130_N$ that, for each cycle, generate signals for or measure signals from specific points on the device under test. Controller 120 may include a computer that is programmed to direct the testing process, process data collected during tests and interface with an operator. Controller 120 may also include circuitry shared by multiple channels or circuitry unrelated to the channels.

In the example of FIG. 1, channel $130_1$ is shown in additional detail. Channel $130_1$ includes circuitry comprising a pattern generator 140, a timing generator 150, and pin electronics 160. The pattern generator 140 is programmed with a "pattern" that defines the operation of the channel during each cycle. For example, pattern generator 140 may indicate the channel should drive a signal with a particular value to DUT 110.

Timing generator 150 creates timing signals that control signal transitions, such as by defining the start of a time when a value should be driven or the time at which the value on a line should be measured.

The pin electronics 160 includes circuitry that drives a stimulus signal into line $180_1$, which will ultimately be fed into DUT 110. Drive circuitry includes a driver 162. In the simplified block diagram of FIG. 1, driver 162 is shown to be preceded by flip-flop 164. Flip-flop 164 is clocked by the timing signal from the timing generator 150 and supplied with data from the pattern generator 140. Flip flop 160 illustrates that both the value output by driver 162 and the time it is output can be controlled.

Pin electronics 160 may also detect signals on line 180, via comparator 166. Comparator 166 receives an input on line $180_1$ from DUT 110 and a reference input from a programmable reference value generator 168. The output from comparator 166 is applied to the input of a latch 165. Latch 165 is clocked by the timing generator 150, which dictates the output value of comparator 166 that is passed along to the pattern generator 140 for further processing. Pin electronics 160, via comparator 166 and the reference value generator 168, indicate whether the detected signal from line $180_1$ is larger or smaller than a specified value indicated by the programmable reference generator 168.

Pin electronics 160 are shown in simplified form. Driver 162 may, for example, receive multiple control signals to specify when a signal is to be provided and its level. Driver 162 might also include a control input to "tri-state" the driver at certain times so that it does not drive line 180. For example, driver 162 may be "tri-stated" when comparator 166 is reading a signal on line 180. Such an example is suited for digital signal detection, but in other implementations, such as analog signal detection, the tester may be adapted to perform other operations. However, FIG. 1 is sufficient to illustrate that a test point on DUT 110 may be connected to a channel in a tester that is loaded with both a comparator and a driver.

Signals exchanged between tester 100 and DUT 110 pass through interface 189. In the simplified sketch of FIG. 1, interface 189 includes a device interface board ("DIB") 190, a connector 172 and a probe card 174. Interface 189 also includes mechanical support and alignment structures, but such structures are not shown for simplicity.

Interface 189 is connected to tester 100 through lines $180_1, 180_2, \ldots 180_N$. These lines are connected to DIB 190. Lines $180_1, 180_2, \ldots 180_N$ may include spring pins that contact pads on DIB 190 or other types of connectors to make a separable connection between DIB 190 and tester 100.

DIB 190 is a circuit board containing traces or other signal paths to route the test and response signals to and from the DUT. DIB 190 may be fabricated using conventional printed circuit board techniques and may include electronic components that customize DIB 190 for testing a specific style of DUT.

DIB 190 is connected through connector 172 to probe card 174. Connector 172 may be a "pogo tower" or similar structure holding numerous spring pins that make a connection between DIB 190 and probe card 174. Alternative connectors include "interposers."

Probe card 174 may also use a printed circuit board as a substrate. Probe card 174 includes compliant members $170_1, 170_2, \ldots, 170_N$ that serve as probes to contact test points on DUT 110. Examples of such compliant members are microscopic contact probes sold by Formfactor Corporation of Livermore, Calif., or those described in U.S. Pat. Nos. 5,900,738; 6,043,563; 6,049,976; and 6,184,053 B1.

Some semiconductor DUTs source enough current to drive a response signal through the DIB and any loads (e.g., 50 Ohm driver loads) present in the tester channel so that the signal can be reliably measured at comparator 166. However, we have recognized that low-power devices may only be able to drive loads with 10 pF or less of capacitance and negligible resistance. The inability to drive the load presented by the tester is compounded for devices outputting high frequency signals. In these situations, a conventional tester interface will not suffice.

A need therefore exists for an improved interface between a tester and a device under test, particularly for testing devices that operate on low-power/high-frequency signals.

SUMMARY OF INVENTION

In one aspect, the invention relates to, a wafer for use in the interface of an automatic test system. The wafer has a plurality of contacts on a first side and a plurality of contacts on a second side. A plurality of buffers are formed in the wafer, each having an input and an output, with the input and the output of each buffer coupled to a contact on a second side.

In another aspect, the invention relates to an interface for an automatic test system comprising a first member having a first side and a second side. The first member has a plurality of contacts formed on each of the first side and the second side. The plurality of contacts on the first side are positioned for interfacing with contacts on the automatic test system. The first member has a plurality of buffer amplifiers each having an input and an output, with the input of each of the buffer amplifiers connected to a contact on the second side. The interface has a second member with a first side and a second side. The second member has a plurality of contacts on the first side and a plurality of probes on the second side, and a plurality of electrically conducting members, each connecting a contact on the second side of the first member to a contact on the first side of the second member.

In another aspect, the invention relates to a method of operating a tester to test a device having a predetermined pattern of test points. The method involves providing a generic member that comprises a plurality of buffer amplifiers, interfacing the generic member to a device specific member that comprises a plurality of compliant members having a pattern matching the predetermined pattern of test points, routing a stimulus signal from a tester through the generic member and the device specific member to a test point on the device under test, and routing an output from a test point on the device under test through a compliant member on the device specific member and a buffer on the generic member to the tester.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
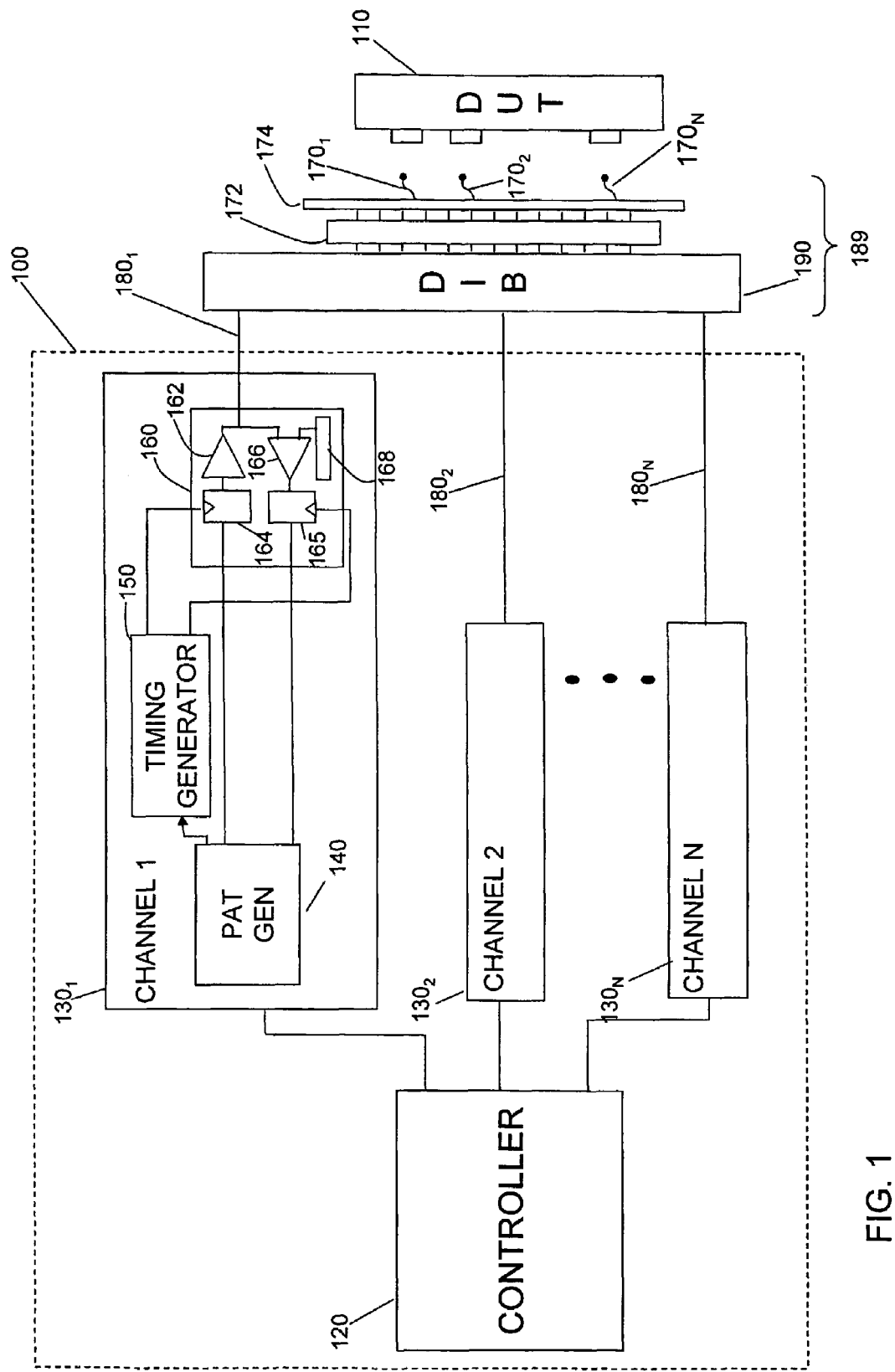
FIG. 1 is a block diagram of a prior art test system.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Figure 2:
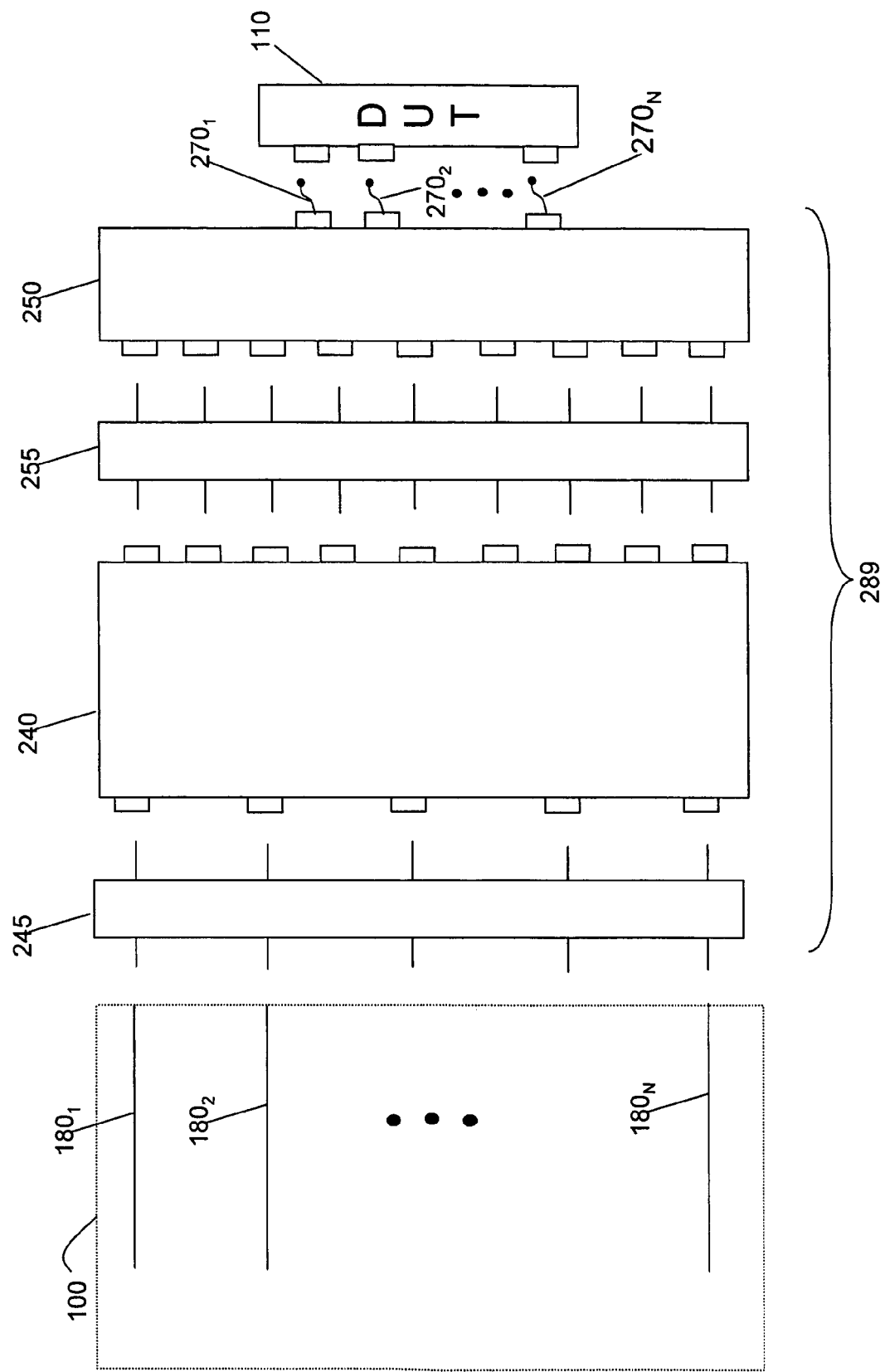
FIG. 2 is a block diagram of an interface between a tester and a device under test.

FIG. 2 illustrates an improved interface 289, which might be used in connection with a tester, such as tester 100 (FIG. 1). Interface 289 makes connection to channels in a tester, represented as lines $180_1$, $180_2$, ... $180_N$, and a DUT 110.

In the illustrated embodiment, interface 289 has a generic component 240 and customized component 250. Customized component 250 contains features that are defined based on the features of a particular DUT. For example, it includes probes that are placed to align with test points on a particular DUT. In contrast, generic component 240 has circuitry that is not customized for a particular DUT style and might be used with many different styles of devices. In the described embodiments, generic component 240 includes circuitry for interfacing to devices that output low-power and/or high frequency signals.

Connections between the components are made through connectors, which may be interposers or other suitable form of connector. Generic component 240 is coupled to a tester 100 through a connector 245 and to customized component 250 through a connector 255.

Generic component 240 comprises a substrate. In one embodiment, the substrate is of a type on which circuit elements may be fabricated. For example, silicon, glass, or ceramic may be used. In an embodiment used as an example below, generic component 240 is a wafer, such as is often used as a substrate in the fabrication of semiconductor devices. Circuitry that is part of the generic component 240 may be fabricated on such a substrate using conventional semiconductor fabrication techniques. Generic component 240 can be fabricated using standard semiconductor device processing methods, including but not limited to lithography, etching, metallization, in addition to micromachining techniques, such as via etching through wafers.

In alternative embodiments, semiconductor chips may be attached to the substrate of the generic component 240. Such fabrication techniques are known to those skilled in the art.

Generic component 240 may include circuitry that passes signals between tester 100 and DUT 110 with or without conditioning. Generic component 240 may also include circuitry that generates or measures signals. Accordingly, circuitry residing in the generic component 240 may include any number of elements that may conventionally reside in the tester channels or may also include additional circuitry not present within conventional channel electronics. Examples of circuitry on the generic component 240 includes switches and buffers. The buffers could be in any suitable form, such as followers, amplifiers, drivers or comparators.

Generic component 250 is in turn coupled, via connector 255, to a customized component 250. In the described embodiment, customized component 250 is customized in two ways. First, it is customized based on the locations of test points on the specific type of device to which it is to interface. Second, it provides customized interconnects that configure the circuitry on generic component 240 to perform the desired functions for interfacing to a specific type of device.

In one embodiment, customized component 250 is also fabricated on a substrate consisting of a material on which conductive paths might be formed. For example, silicon, glass, or ceramic can be used. In one embodiment used as an example below, customized component 250 is formed on a wafer, as traditionally used in the fabrication of semiconductor devices. Customized component 250 can be fabricated using standard semiconductor device processing methods, including but not limited to lithography, etching, metallization, in addition to micromachining techniques, such as via etching through wafers.

Customized component 250 has compliant members $270_1$, $270_2$, ... $270_N$ coupling the customized component 250 to test points on DUT 110. Compliant members can be formed in the same way that probes are formed in prior art probe cards. Alternatively, structures as are described in U.S. Pat. No. 6,497,581 to Slocum et al., which is hereby incorporated by reference, may be used.

Figure 3A:
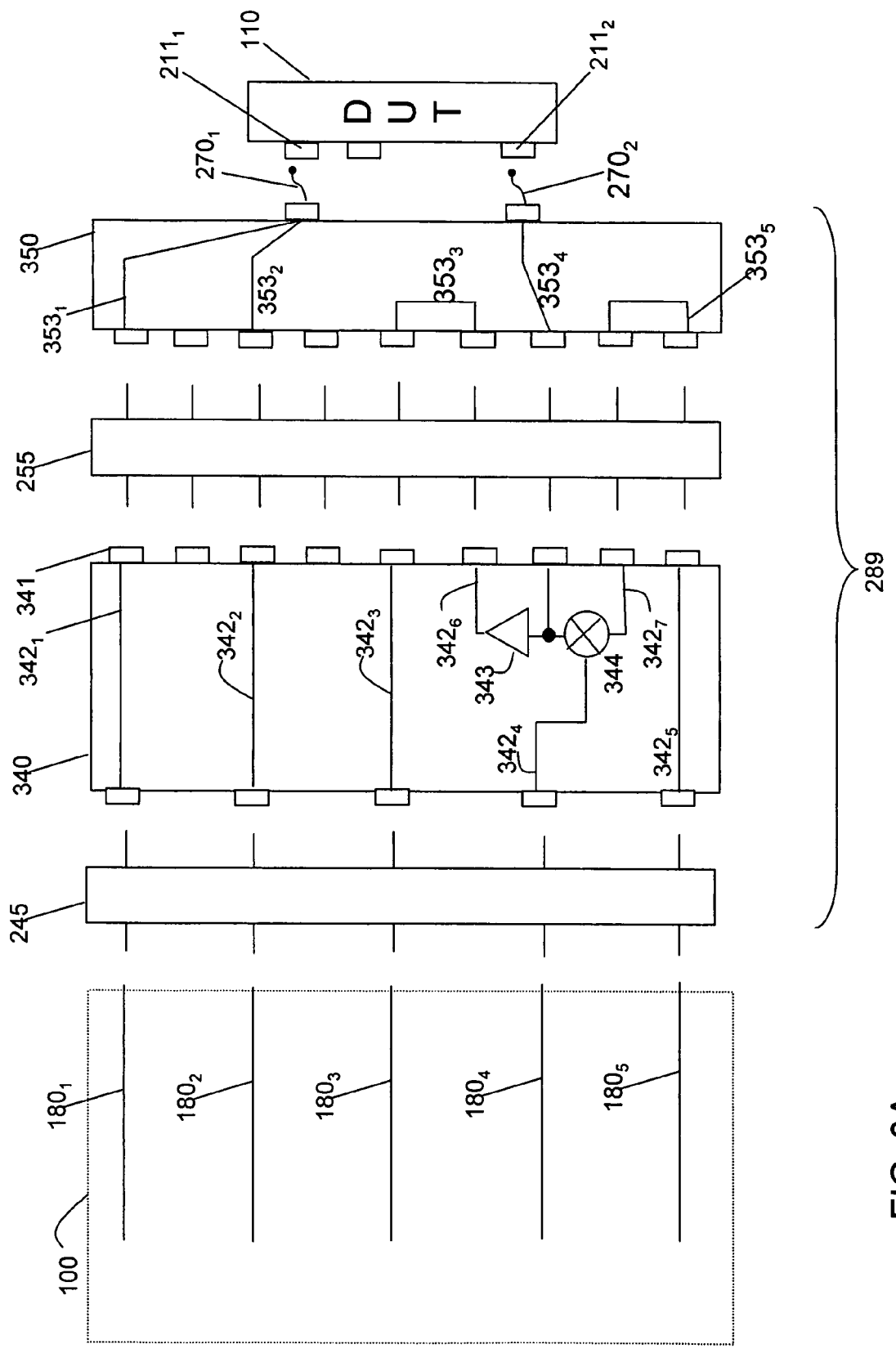
FIG. 3A is a schematic diagram of an interface between a tester and a device under test.

FIG. 3A illustrates an embodiment of interface 289. In this embodiment, generic component 240 and customized component 250 are provided as a generic wafer 340 and the customized wafer 350, respectively.

Generic wafer 340 has a plurality of vias, such as vias $342_1$, $342_2$, $342_3$, each allowing a signal to pass from a conductive contact on one surface of generic wafer 340 to an opposing side. Vias might be formed according to any known process, such as micromachining a hole through wafer 340 and plating it with a conductor, such as metal.

Generic wafer 340 may contain circuitry to assist in the conditioning of signals passing between a tester 100 and DUT 110. In the illustrated embodiment, generic wafer 340 contains multiple buffers, of which a single follower 343 is shown for simplicity. In the described embodiment, follower 343 has a relatively large input impedance, thereby presenting a very low load to signals at its input. Follower 343 has output characteristics that allows it to drive the load such as might be presented by circuitry within tester 100 to which they may be connected. For example, comparator 166 and driver 162 (FIG. 1) may be driven by an output of DUT 110. Buffers here are illustrated as unity gain amplifiers, which provide relatively low power operation and may be termed "follower" amplifiers. However, any suitable form of buffer may be used.

Generic wafer 340 also contains multiple semiconductor switches, of which a single switch 344 is shown for simplicity. Switches such as 344 may be simple on/off type switches, sometimes called transmission gates. Preferably, switch 344 has a very low on resistance. However, any suitable design for a switch may be used.

Connections to the inputs and outputs of the semiconductor devices, such as switch 344 and follower 343 are made through vias, such as $342_4$, $342_6$, and $342_7$.

Semiconductor devices can be formed in a wafer according to known semiconductor processing techniques. Such devices require power connections, which are not explicitly shown, but can be provided through vias that connect to tester 100.

Customized wafer 350 has custom interconnections tailored to DUT 110. Compliant members such as $270_1$ and $270_2$ are aligned with test points on the DUT 110. Connections to compliant members such as $270_1$ and $270_2$ are made through vias, such as vias $353_1$, $353_2$ and $353_4$. Vias $353_1$, $353_2$ and $353_4$ include contact portions on the surface of customized wafer 350 facing generic wafer 340 so that they might be easily connected to the appropriate vias on generic wafer 340. Preferably, the pattern of contacts on the surface of custom wafer 350 is the same as the pattern of contacts on the opposing surface of generic wafer 340.

In addition, customized wafer 350 includes conducting paths such as $353_3$ and $353_5$ that do not connect to a test point on DUT 110. Rather, these conducting paths connect contact points within generic wafer 340 to configure generic wafer 340 to perform the functions required for testing of DUT 110. Such conducting paths may be used to vary the signal path between tester 100 and DUT 110. Even when a generic wafer is used, customized wafer 350 allows a signal path with the appropriate characteristics to be created. For example, signal paths can be provided that are useful for low-power, fly-by and 50 Ohm configurations.

Low-power configurations are desirable for connecting to test points on DUT 110 that generate low-power output signals. Such test points do not have sufficient power levels to drive the signal path to comparator 166. Low-power configurations are useful when the response signal generated by the DUT 110 is low-power, but must drive a line into tester 100 that has a relatively large load (e.g., 50 Ohm load).

Figure 3C:
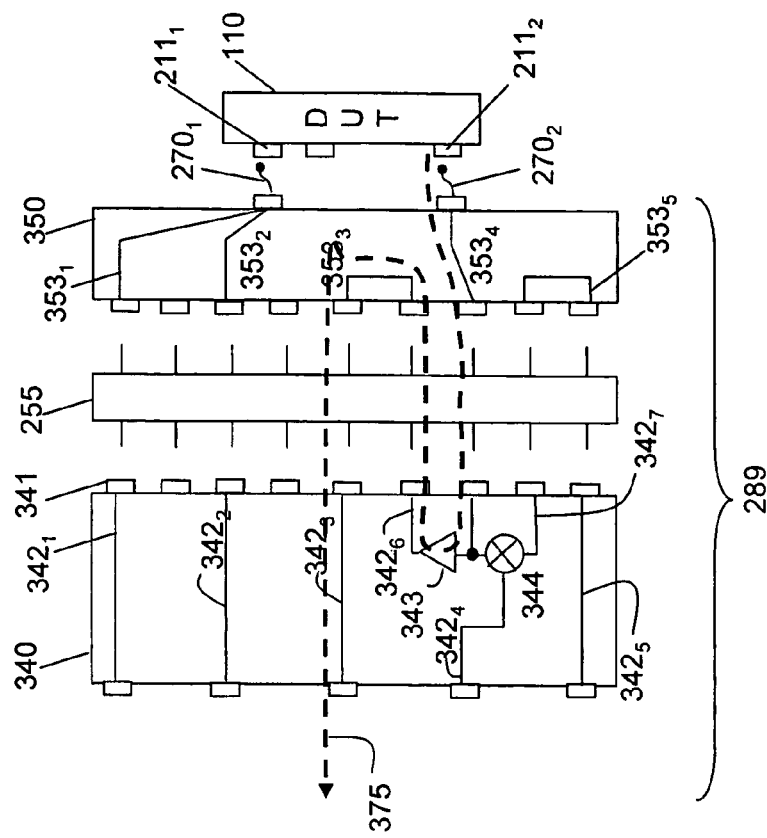
FIGS. 3B, 3C, 3D and 3E are schematic diagrams of the interface of FIG. 3A configured for specific functions.
Figure 3B:
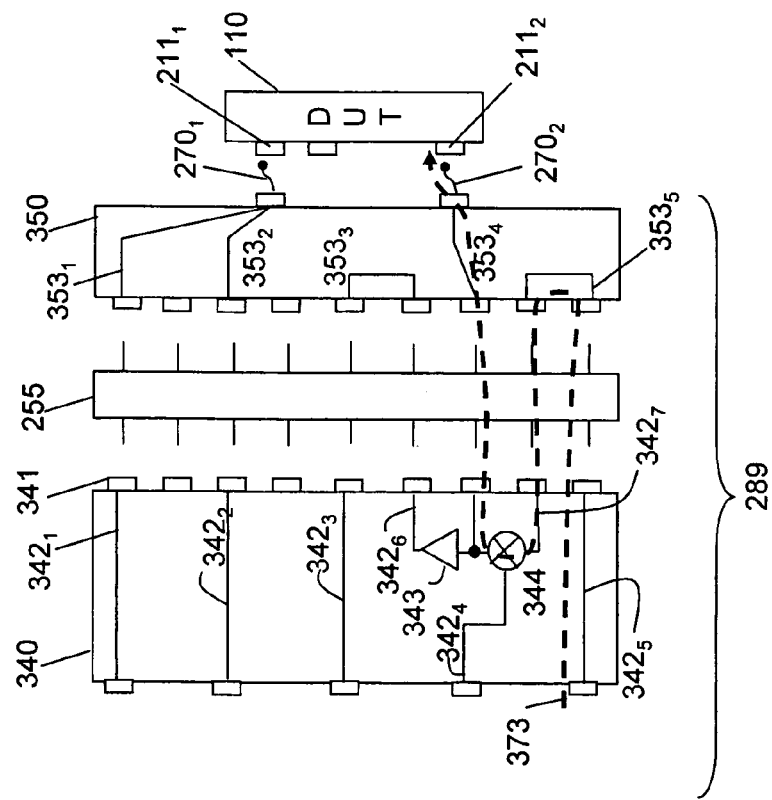

A low-power configuration for test point $211_2$ is illustrated in FIGS. 3B and 3C. A low-power configuration may be used with a test point that outputs signals only or that can alternatively input or output a signal. If the test point outputs only, it would not be necessary to drive a signal from the tester to the device. Accordingly, the configurations of FIG. 3B and FIG. 3C may be used alternatively for a test point having both input and output operations. The configuration of FIG. 3B alone may be used for test points having only input characteristics. The configuration of FIG. 3C may be used alone for test point having only output characteristics.

In FIG. 3B, interface 289 provides a signal path 373 to drive a signal to test point $211_2$. In this simplified illustration, via $342_5$ is connected to a channel within tester 100. The drive signal from that channel is coupled through to via $353_5$ in customized wafer 350. There, it is routed on conducting traces to a second via on the surface of customized wafer 350 where it is coupled back to generic wafer 340. Within generic wafer 240, the drive signal passes through switch 344. When a signal is to be driven to test point $211_2$, switch 344 is controlled to be in its ON state. The state of switch 344 is set by control signals sent by tester 100, such as on an I/O line $180_4$. The drive signal passes through switch 344 and is then coupled back to customized wafer 350 where it passes through via $353_4$ to test point $211_2$.

In FIG. 3C, interface 289 provides a signal path 375 for a low power signal from test point $211_2$ to tester 100. To route a low power output from test point $211_2$, switch 344 is set to the OFF state by a signal sent on the I/O line $180_4$. In this configuration, drive circuitry within tester 100 that was connected to test point $211_2$ through via $342_5$ is isolated through switch 344 and does not load the output of DUT 110. However, follower 343 remains coupled to the compliant member $270_2$ and the corresponding test point on the DUT 110.

Follower 343 transmits the response signal generated by the DUT 110 through connection $353_3$ in customized wafer 350. The signal path continues back along the via $342_3$ in the generic wafer 340 and to a line such as $180_3$ (FIG. 3A) that feeds into tester 100. Follower 343 presents a low load to the output of DUT 110, but is able to provide a signal to tester 100 that can be measured.

The response signal may then be processed further by the tester as required by the testing program. For example, the level of the signal may be measured in comparator 166 (FIG. 1). In this embodiment, follower 343 serves as a buffer, without amplification.

Figure 3E:
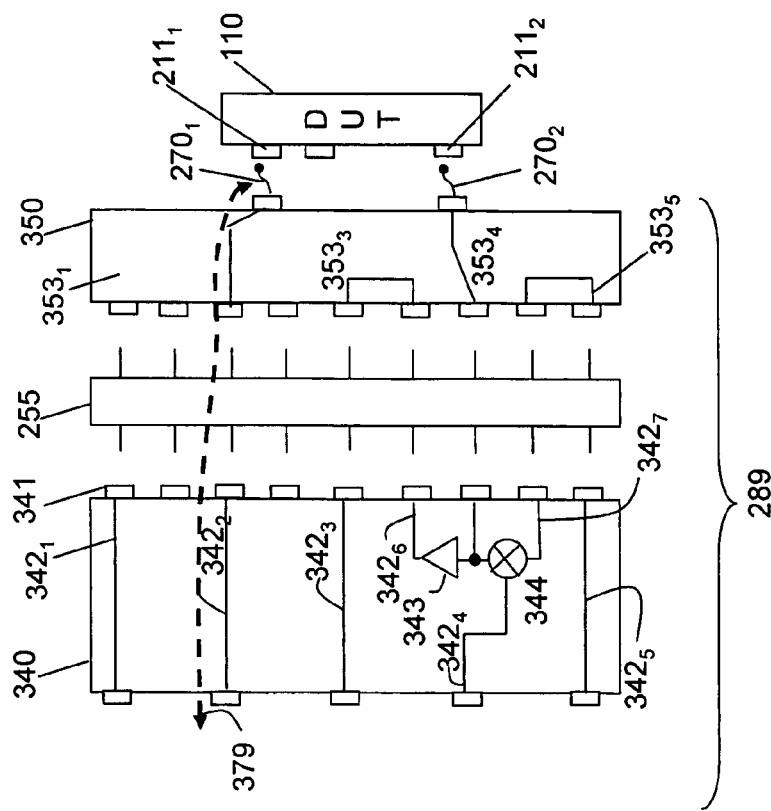
Figure 3D:
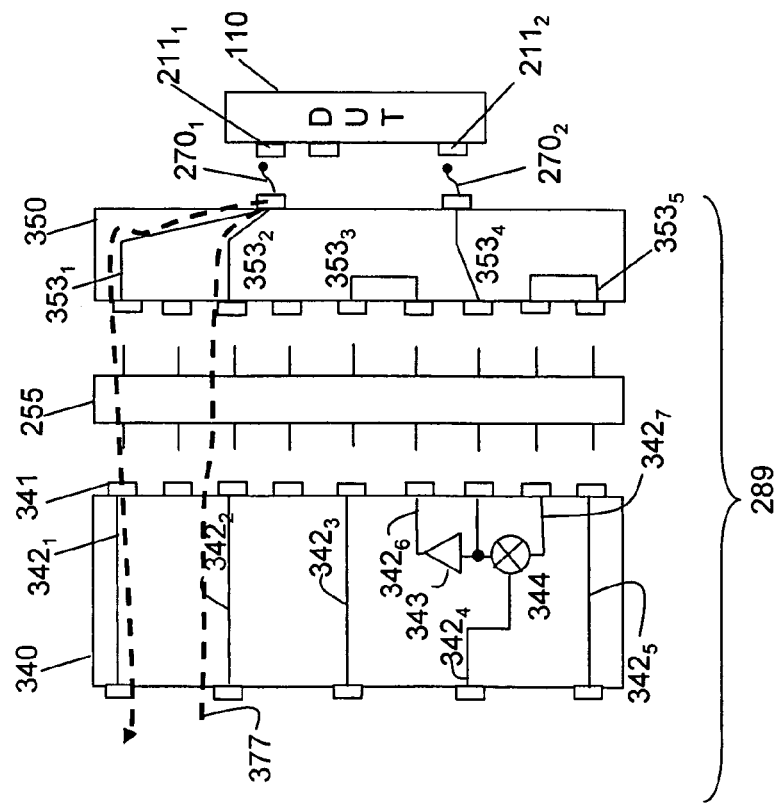

In a fly-by configuration, a test point on the DUT 110 is coupled to both drive-in and compare-out lines at all times. FIG. 3D illustrates interface 289 configured with a signal path 377 for fly-by testing. In this configuration, a stimulus signal is provided by tester 100 on a line such as line $180_2$ (FIG. 3A) and is transmitted through a connector 245 and into via $342_2$ in the generic wafer 340. The stimulus signal is then fed into the customized wafer 350 through connector 255. The stimulus signal is then applied to the test point on the DUT 110 through via 352$_2$ of the customized wafer 350. A response signal passes through via 353$_1$, and via 342$_1$. In this configuration, a response signal may be sensed by a channel in the tester connector to a line, such as line 180$_1$ (FIG. 3A).

Numerous other test point configurations are possible. For example, a 50 Ohm configuration can be formed by connecting one of the vias passing through generic wafer 340 to a compliant member, such as 270$_1$. FIG. 3E shows a signal path 379 created for a 50 ohm signal. In this configuration, one line serves as both a drive-in and compare-out line for the test point stimulus and response signals. Such a configuration can be used, for example, if a test point on DUT 110 can output sufficient power to drive the load represented by tester 100.

Figure 4B:
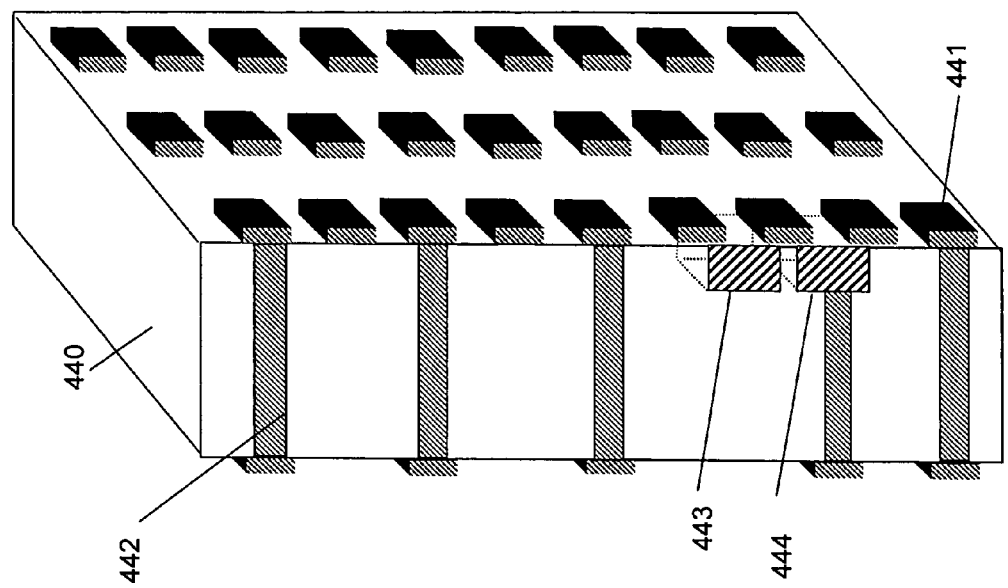
FIG. 4B is a perspective view illustrating a generic wafer in accordance with one embodiment of the invention.
Figure 4A:
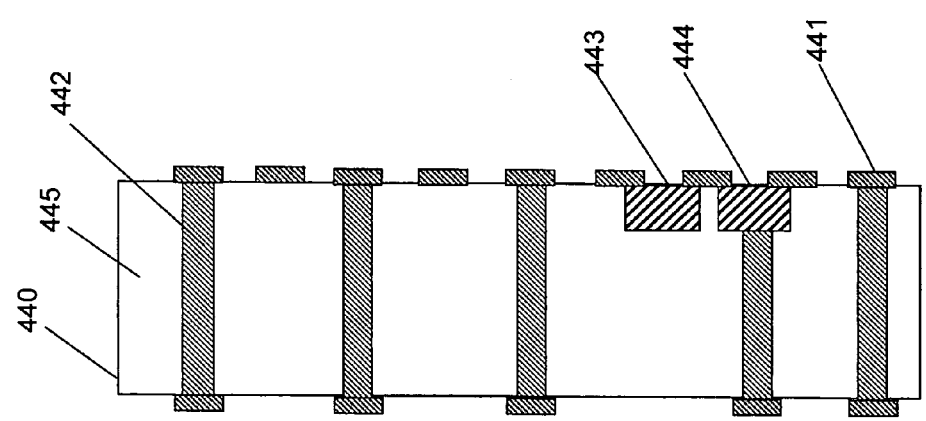
FIG. 4A is a cross-section illustrating a generic wafer in accordance with one embodiment of the invention.

FIGS. 4A, 4B, 5A and 5B give additional details of construction of the components of interface 289. FIG. 4A illustrates the cross-section of a generic wafer 440 in accordance with one embodiment wherein the generic wafer 440 comprises a substrate 445 with contacts, vias and circuitry. Generic wafer 440 includes a body 445 composed of any suitable material, possessing the desirable electronic and mechanical properties. For example, if electronic circuits are fabricated on the substrate, a silicon wafer may be preferred. If chips are mounted on the substrate, glass or ceramic may be preferred.

To enable electrical connections from one side of generic wafer 440 to the other, vias 442 can be etched through the body. For example, micro-machining techniques can be used. Deep etching of via holes through silicon or glass is a known micromachining technique. Using anisotropic ion etching at low substrate temperatures below 300° C. and a $SF_6/O_2$ gas chemistry, silicon etch rates as high as 10 μm/min are possible, allowing for the etching of vias 442. Vias 442 may be metalized with any suitable metal, forming an electrical connection between the front and back-side of the body. For example, sputtering techniques may be used to deposit a thick layer of metal into a deep hole, thereby filling the hole and forming an electrical connection.

Metal contacts 441 are formed on both sides of the body. Contacts 441 serve as electrical contact pads for the pins or other contact members in connectors 245 and 255. Metal contacts 441 may be formed by any suitable means, such as depositing a metal layer across the entire wafer and patterning the contact areas with a lithography step.

In the illustration in FIG. 4A, circuitry formed in body 445 is illustrated by a switch 444 and a follower 443. FIG. 4A shows only two components formed in body 445. In many applications, it will be preferable to form numerous other circuit elements. If body 445 is a semiconductor, such as silicon, this circuitry may be fabricated directly in the silicon. For example, both the switch 444 and the follower 443 might be fabricated with standard silicon CMOS or bipolar technologies. If the circuits are fabricated in the body, the circuit fabrication may precede the via and contact metallization so as to avoid metal contamination of device channels. Once fabricated, the switch 444 and follower 443 circuits may be interconnected with each other and the appropriate contacts 441 with metal interconnects.

In an alternative embodiment in which glass, ceramic, or glass-ceramic bodies are used, chips may be mounted onto the substrates and interconnected with one or more levels of metal, in much the same way that a multi-chip module is formed. In such a module, the chips may be standard off-the-shelf parts, and may be mounted to the substrate with any convenient technique, including, for example, solder bump bonding. Details relating to forming multi-chip modules are known in the art.

FIG. 4B illustrates a perspective view of the generic wafer 440. In this embodiment, contacts 441 form an arrangement on a surface of body 445. For example, FIG. 4B illustrates a recta-linear arrangement of contacts with a specific density one side of the generic wafer 440, but the contacts on either side of the wafer 440 may be arranged in any desired configuration. Preferably, the contact positions are compatible with the pin layouts of the connectors 245 and 255.

Preferably, generic wafer 440 is formed with numerous copies of the structures needed to form each type of connection. For example, to form a low power connection as shown above in connection with FIGS. 3B and 3C, two 50 ohm connections, a buffer amplifier and a switch within generic wafer 340 are interconnected. Preferably, generic wafer 440 is fabricated with groupings of such components to allow multiple low power connections to be established to a DUT. Likewise, a flyby connection requires two 50 ohm vias. Preferably, multiple 50 ohm connections are provided within generic wafer 440.

Figure 5B:
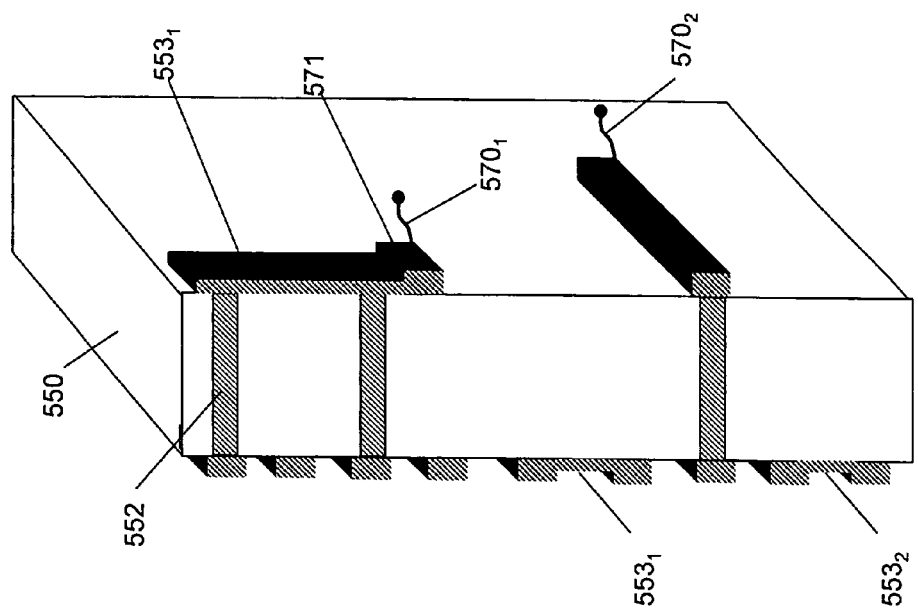
FIG. 5B is a perspective view illustrating a customized wafer in accordance with one embodiment of the invention.
Figure 5A:
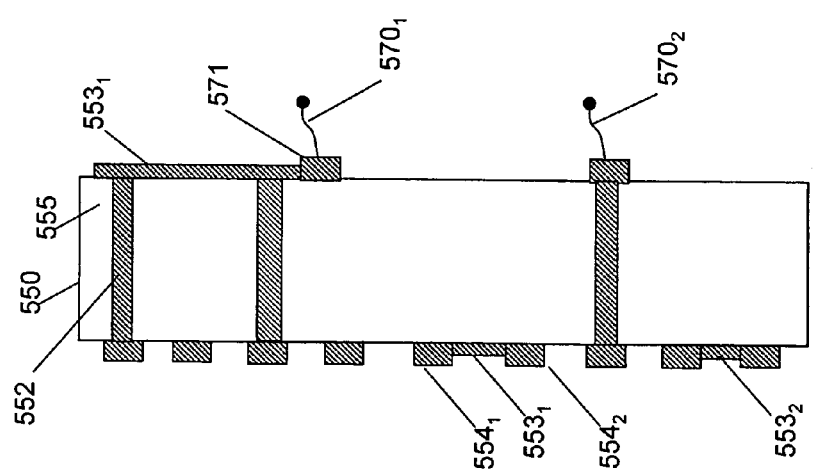
FIG. 5A is a 5 cross-section illustrating a customized wafer in accordance with one embodiment of the invention.

FIG. 5A illustrates the cross-section of an embodiment of custom wafer 550. In this embodiment, custom wafer 550 has a body 555. Body 555 may be any suitable material possessing desirable electronic and mechanical properties. For example silicon, glass, ceramic, or glass-ceramic can be used. Contacts, vias and compliant members 570 are also formed on custom wafer 550. Compliant members 570 serve as contact probes. The locations of the contact probes on the custom wafer 550 are tailored to the type of DUT to be tested with custom wafer 550.

To enable electrical connections between either side of the custom wafer, vias 552 are etched through the substrate with known micro-machining methods. For example, deep etching of via holes through silicon or glass is a known micromachining technique. Vias 552 are metalized with any suitable metal, forming an electrical connection between the front and back-side of the body. For example, sputtering techniques may be used to deposit thick layers of metals into deep holes, thereby filling the hole and forming an electrical connection.

Metal contacts 551 are formed on both sides of the substrate. Contacts 551 serve as electrical contact pads for the pins or other contact members in connectors 245 and 255. For example, metal contacts 551 may be formed by depositing a metal layer across the entire wafer and patterning the contact areas with a lithography step.

Metal connections 553 are also present on at least one side of the custom wafer 550, allowing for the connection of contact pad 554. Connections 553 enable stimuli signals to be redirected back into the generic wafer without significant alteration or to otherwise connect the components of generic wafer 440 to configure the interface for the type of DUT to be tested.

FIG. 5B illustrates a perspective view of the custom wafer 550. In this embodiment, contacts 553 form an arrangement allowing for connections with an adjacent connector, such as 255 (FIG. 2). The contacts on the side of the wafer 550 facing DUT 110 are preferably arranged so as to probe desired test points on the DUT.

Having thus described several aspects of at least one embodiment of this invention, it is to be appreciated various alterations, modifications, and improvements will readily occur to those skilled in the art.

For example, conducting paths are described as being made through wafers using "vias." Conducting paths may be formed using vias, traces or other structures or any combination of structures.

Also, it is described that signal conditioning circuitry is fabricated on generic wafer 340. Customized wafer 350 could contain circuitry instead of or in addition to circuitry in generic wafer 340.

Further, three types of connections that can be made using a generic wafer 340 are described. The invention is not limited to any one type of test point configuration, and different configurations may be used for different test points on the DUT 110. Also, although only a low-power, fly-by and 50 Ohm configuration were described, these are examples of the types of connections that might be made, and any number of other configurations may be implemented with the invention.

As another example, various alternative embodiments of custom wafer 550 and generic wafer 440 are possible. For example, the number of circuit elements in generic wafer 440 might be varied to perform desired processing on either the stimulus or response signals. Also, although vias were used to interconnect either side of the wafers, other techniques are possible and the invention is not limited to the specific examples presented.

Also, it was described that generic wafer 340 includes unity gain followers to buffer signals passing from DUT 110 to tester 100. Buffering may be provided by circuits that also provide gain or by circuits other than amplifiers.

Further, it was described that a custom component customizes the generic component in at least two ways: by providing probes aligned with test points on the DUT and by interconnecting generic circuitry in the generic components. These functions may be formed by physically separate pieces that may be mounted on the same or opposite sides of the generic component.

Such alterations, modifications, and improvements are intended to be part of this disclosure, and are intended to be within the spirit and scope of the invention. Accordingly, the foregoing description and drawings are by way of example only.

What is claimed is:

1. An interface for an automatic test system having contacts through which test signals may be coupled to or from circuitry within the tester, the interface comprising:
a first component having a first side and a second side comprising:
   a plurality of contacts formed on each of the first side and the second side, the plurality of contacts on the first side positioned to be electronically coupled to the contacts on the automatic test system;
   circuitry having a plurality of input and outputs, with each input and each output connected to a contact on the second side;
a second component having a first side and a second side, the second component comprising:
   a plurality of contacts on the first side;
   a plurality of probes on the second side;
   a first plurality of conducting members each positioned to interconnect at least two contacts formed on the second side of the first component, whereby at least two of the inputs or outputs of the circuitry are coupled through each of the second plurality of conducting members; and
   a second plurality of electrically conducting members, each connecting a contact on the second side of the first component to a contact on the first side of the second component.

2. The interface of claim 1 wherein the first component comprises a semiconductor wafer.

3. The interface for an automatic test system of claim 1 wherein the first plurality of conducting members comprise a plurality of conductive traces each joining contact members on the first surface of the second component.

4. The interface for an automatic test system of claim 3 wherein the second component comprises a semiconductor wafer.

5. The interface for an automatic test system of claim 3 wherein the second component comprises a plurality of pairs of conductive members, each pair connecting a probe on the second side to a first contact on the first side and a second contact on the first side.

6. The interface for an automatic test system of claim 1 wherein the second plurality of electrically conducting members comprises a plurality of compliant members.

7. The interface for an automatic test system of claim 6 wherein the second plurality of electrically conducting members form an interposer.

8. The interface for an automatic test system of claim 1 wherein the circuitry comprises signal conditioning circuitry.

9. The interface of claim 1, wherein the first component comprises a wafer having a side forming the first side and a side forming the second side, and wherein the circuitry comprises:
   a plurality of buffers formed in the wafer, each having an input and an output, with the input of each buffer coupled to a contact on the second side and the output of each buffer coupled to a contact on the second side.

10. The wafer of claim 9, wherein the circuitry further comprises a plurality of switches formed in the wafer, each switch having at least two signal terminals and a control input terminal, with each of the at least two signal terminals being coupled to a contact on the second side of the wafer and the control input terminal being coupled to a contact on the first side of the wafer.

11. The wafer of claim 10, wherein a signal input terminal of each of the plurality of switches is coupled to the input of one of the plurality of buffers.

12. The wafer of claim 11, additionally comprising a plurality of conductive vias, each joining a contact on the first side to a contact on the second side.

13. The wafer of claim 11, wherein the plurality of buffers, the plurality of switches and the plurality of conductive vias are disposed in a plurality of groups, each group having a buffer, a switch and at least two conductive vias.

14. The wafer of claim 9, wherein the wafer comprises a semiconductor wafer.

15. The wafer of claim 9, wherein each of the buffers comprises an amplifier.

16. The wafer of claim 15, wherein each of the amplifiers is a unity gain amplifier.

17. A method of operating a tester to test a device having a predetermined pattern of test points using an interface as recited in claim 1, the method comprising:
   providing a generic component that comprises a plurality of buffers, the generic component being the first component;

interfacing the generic component to a device specific component, the device specific component being the second component and the plurality of probes being disposed in a pattern matching the predetermined pattern of test points;

routing a stimulus signal from the tester through the generic component and the device specific component to a test point on the device under test;

routing an output from a test point on the device under test through a probe on the device specific member and a buffer on the generic component to the tester.

18. The method of operating a tester of claim 17 wherein:

providing a generic component comprises a providing a generic component comprising a plurality of switches each coupled to an input of a buffer of the plurality of buffers;

routing a stimulus signal from the tester through the generic component comprises closing a switch; and routing an output from a test point through a buffer on the generic component comprises opening a switch connected to the buffer.

19. The method of operating a tester of claim 17 wherein:

routing a stimulus signal from the tester through the device specific component comprises routing the signal through a first conductive via connected to a probe; and routing an output from a test point through the device specific component comprises routing the signal through a second conductive via connected to the probe.

20. The method of operating a tester of claim 17 wherein:

routing a stimulus signal from the tester through the device specific component comprises routing the signal through a first conductive via connected to a first probe; and routing an output from a test point through the device specific component comprises routing the signal through a second conductive via connected to a second probe.

21. The method of operating a tester of claim 17 wherein providing a generic component comprises providing a semiconductor wafer having a plurality of buffer amplifiers formed therein.

22. The method of operating a tester of claim 21 wherein providing a generic component comprises providing a semiconductor wafer having a plurality of semiconductor switches formed therein.

23. A method of manufacturing semiconductor devices comprising:

operating a tester according to the method of claim 17;

processing, in the tester, the output from a test point to produce a test result; and altering the process used to manufacture the device based on the test result to produce an altered manufacturing process.

24. The method of manufacturing semiconductor devices of claim 23 additionally comprising manufacturing a plurality of semiconductor devices according to the altered manufacturing process.

* * * * *